United States Patent [19]
Monge-Navarro et al.

[11] Patent Number: 6,125,267
[45] Date of Patent: Sep. 26, 2000

[54] METHOD FOR IMPROVING THE TUNING OF A RADIO RECEIVER AND A RADIO RECEIVER

[75] Inventors: Alejandro Monge-Navarro, Salo, Argentina; Pekka Mellanen, Marttila; Ari Heikkinen, Halikko, both of Finland

[73] Assignee: Nokia Mobile Phones Limited, Espoo, Finland

[21] Appl. No.: 08/963,811

[22] Filed: Nov. 4, 1997

[30] Foreign Application Priority Data

Nov. 5, 1996 [FI] Finland .................................. 964442

[51] Int. Cl.[7] ...................................................... H04B 1/16
[52] U.S. Cl. ........................ 455/161.1; 331/11; 455/184.1
[58] Field of Search ................... 455/181, 182.1, 455/182.2, 182.3, 183.1, 183.2, 184.1, 185, 192.1, 192.3, 260, 265; 375/344, 326, 329, 202, 330

[56] References Cited

U.S. PATENT DOCUMENTS

| | | | |
|---|---|---|---|
| 4,151,463 | 4/1979 | Kibler | 324/82 |
| 4,940,951 | 7/1990 | Sakamoto | 331/4 |
| 5,430,891 | 7/1995 | Kianush et al. | 455/184.1 |
| 5,457,815 | 10/1995 | Morewitz, II | 455/161.1 |
| 5,524,288 | 6/1996 | Monge Navarro et al. | 455/180.4 |
| 5,699,385 | 12/1997 | D'Sylva et al. | 375/344 |
| 5,731,741 | 3/1998 | Yamamoto et al. | 331/11 |

FOREIGN PATENT DOCUMENTS

| | | |
|---|---|---|
| 3902826A1 | 10/1989 | Germany . |
| WO95/15640 | 4/1995 | WIPO . |

*Primary Examiner*—Daniel S. Hunter
*Assistant Examiner*—Pablo Tran
*Attorney, Agent, or Firm*—Perman & Green, LLP

[57] ABSTRACT

In order to tune a radio receiver (10) to an optimal tuning frequency it is found the critical frequency closest to the current tuning frequency (60) at which the radio receiver loses the locking to the clock frequency of the received signal, and, if necessary (62), the tuning frequency is corrected away from the critical frequency found. The control block (13) of the radio receiver comprises means for adjusting the tuning of the reception part (11) in response to the information (17) indicating whether the locking to the clock frequency is on. The search for the critical frequency may be performed in on or two stages and alternately on both sides of the current tuning frequency or first on one side and then on the other.

12 Claims, 4 Drawing Sheets

METHOD FOR IMPROVING THE TUNING OF A RADIO RECEIVER AND A RADIO RECEIVER

BACKGROUND OF THE INVENTION

The invention relates in general to the tuning of a radio receiver to a certain frequency and in particular to automatic tuning in order to ensure the best possible radio signal quality.

Field of the Invention

Reception of a radio transmission suffers from spurious effects caused by the widening and shifting of the frequency band of the received signal, other radio transmissions at the same and adjacent frequencies and other electromagnetic radiation sources. In the receiver, the spurious effects are seen as noise and signal distortion. The problem is made more difficult by the fact that the spurious effects usually vary in time, especially in the case of mobile terminals. In addition to external spurious effects, also internal factors in the receiver, such as component aging, manufacturing tolerances, temperature drift, intermodulation frequencies, etc. affect the need for frequency tuning.

Description of the Prior Art

It is known a prior art method called automatic frequency control (AFC), where the receiver includes a variable missing frequency oscillator, a measurement circuit for measuring the received signal power, and a feedback loop which controls the oscillator so that mixing to the intermediate frequency is always performed using the mixing frequency that produces the highest received signal power. The disadvantage of this method is that the highest received signal power does not always correspond to the best signal quality e.g. in a situation where the receiver picks up an unwanted signal occurring at the same or nearly the same frequency as the desired signal. The turned frequency is such that the attenuation of the intermediate frequency signal path is as low as possible. If the transmission curves of the filters are not symmetrical (the attenuation minimum at the middle of the pass band), the intermediate frequency will be detuned even if the receiver received nothing else than the desired signal. Tolerances of filters and their control circuits may cause considerable detunig so that the received signal becomes distorted and its quality deteriorates.

Another known method is to use a frequency synthesizer, or an accurately tuned mixing oscillator which produces a mixing frequency that is a multiple of a fundamental frequency produced by a stable crystal oscillator. As the mixing frequency remains accurately the same, the receive filter can be made very narrowband so that the influence of spurious effects propagating as other frequences is reduced. The disadvantage of this method is that if the transmitter or receiver or a factor reflecting the radio signal on the path moves, the frequency of the desired signal will not remain constant but, instead, will change, which means that it may drift outside the narrow pass band of the filter. Furthermore, the tolerances of the filters and matching circuits may cause the signal path attenuation not be at its minimum at the nominal frequency. Then the signal-to-noise ratios will suffer, ie. the signal quality will get worse. The method is also susceptible to changes in component characteristics that occur in the course of time.

A prior art method is called automatic gain control (AGC), where a signal coming to a receiver is attenuated in the pre-stage of the device if the received signal level is too high. In the AGC, the tuning of the receiver is not changed. For a double super-heterodyne receiver, which has two intermediate frequencies, it is also known to detune the first mixing frequency obtained from the local oscillator so that the first intermediate frequency signal becomes offset. The second mixing frequency from the local oscillator is also detuned, however in such a manner that the second intermediate frequency signal moves, with respect to the nominal frequency, to the direction opposite to that of the first intermediate frequency signal. Then the effective bandwidth across the intermediate frequency stages becomes narrower. Narrowing the widening of the band may be based on the received signal level or on the signal-to-noise ratio. However, adjustment of the bandwidth and noise detection require separate components that increase manufacturing costs.

The method is known from the Finnish patent application FI 962509, wherein a receiver decodes a digital signal and measures the frequency of occurrence of bit errors in the signal. The receiver turns the oscillator frequency used in the down-conversion such that the bit error ratio (BER) is as low as possible. However, this method is relatively slow since the receiver examines several parallel frequencies and it has to demodulate and decode at each frequency a whole frame or other data structure so as to be able to determine, on the basis of the CRC (cyclic redundancy check) code or a corresponding part of said data structure, whether bit errors occurred in the signal on the transmission path.

Objects of the Invention

An object of this invention is to provide a method by means of which a receiver can automatically tune itself to the correct frequency in a quick and easily realizable manner. Another object of the invention is to provide a radio receiver which can apply the method according to the invention and which has no need for expensive special components.

The objects of the invention are achieved by monitoring how the receiver stays locked to the clock pulse of the received signal and by tuning the receiver to the middle of the frequency band where locking is successful.

SUMMARY OF THE INVENTION

The method according to the invention is characterized in that therein a current frequency is found by tuning the radio receiver in such a manner that the intermediate frequency is on the pass band of the receiver's IF filter, and the closest critical frequency at which the radio receiver loses synchronization to the clock frequency of the received signal is also found out, and the tuning frequency is corrected on the basis of the difference of the critical frequency found and the current frequency.

The invention is also directed to a radio receiver which realizes the method according to the invention. The radio receiver according to the invention is characterized in that its control block comprises means for adjusting the tuning of the reception part in response to the information indicating whether locking is on.

The term "clock frequency" must her be understood as having a broad meaning because it refers to all those substantially constant-frequency parts of the received signal on the basis of which the receiver can by a simple detection determine whether it is correctly synchronized to the received signal.

BRIEF DESCRIPTION OF THE DRAWINGS

The invention is described in more detail with reference to the preferred embodiments presented by way of example and to the attached drawing, wherein.

DETAILED DESCRIPTION OF THE PROFFERED EMBODIMENTS

Figure 1:
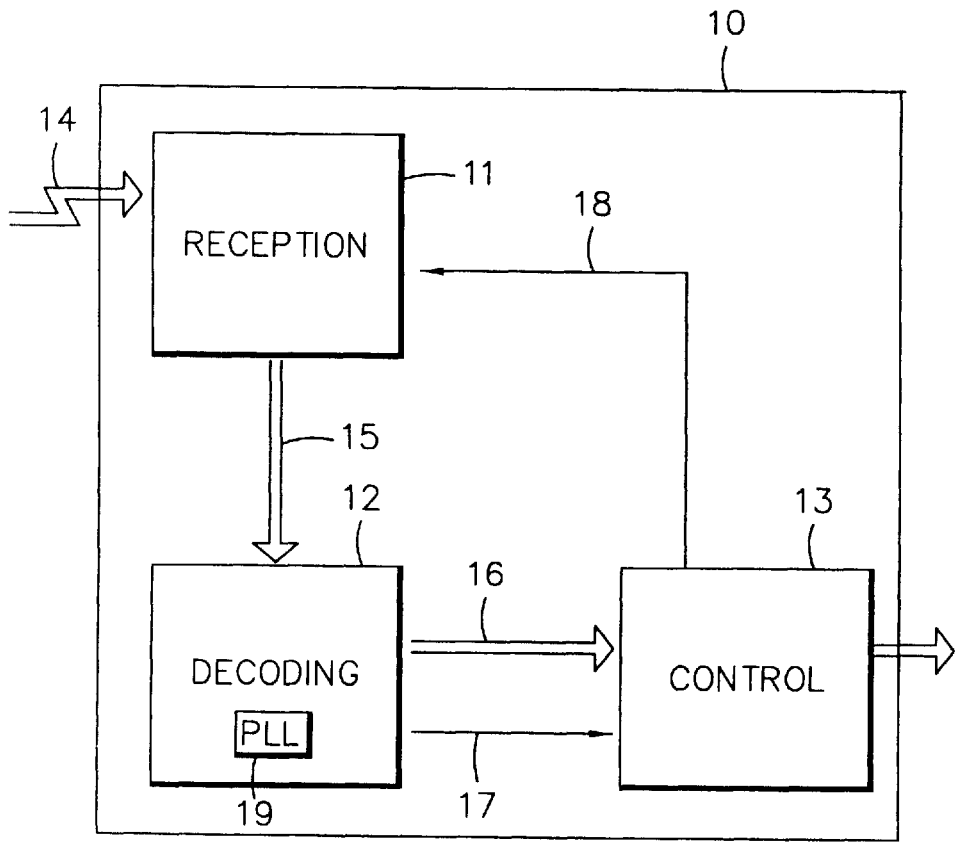
FIG. 1 shows a block diagram of a radio receiver that can apply the method according to the invention.

FIG. 1 shows a radio receiver 10 which comprises, among other things, a reception, dow-conversion and demodulation part 11 (which will be hereinafter called a reception pat in short), a decoding part 12 and a receiver control bock 13. A radio signal 14 arrives in the reception part 11, and a demodulated signal 15 is sent from the reception part to the decoding part 12. The decoding part directs the decoded signal 16 to the control block 13 and also indicates whether it is locked to the clock frequency of the received signal. "Locking" means that the phase-locked loop 19 in the decoding part 12 or other known synchronizing element indicates that the clock in the decoding part of the clock frequency signal in the received signal are synchronized. The indication about the locking or absence of locking is denoted by reference designator 17 in FIG. 1. Reference designator 18 represents the commands issued by the control block 13 to the reception part 11 in order to change the tuning frequency or frequencies. The command link between blocks 11 and 13 may also be bidirectional, so that the reception part 11 sends information to the control block 13 regarding the frequency in use and other relevant matters.

The method according to the invention can be advantageously applied in selective call receivers and other portable radio devices where, as is known, low power consumption is a very significant factor affecting practicability. So, it is desirable that the application of the method according to the invention to the radio apparatus according to FIG. 1 will not significantly increase the power consumption of the apparatus. Selective call receivers and other portable radio devices are often characterized in that a particular device receives information only at times, so that during other times the device is in passive state where it uses the minimum amount of electric power. On the other hand, when the deice is receiving information, its decoder must be continuously locked to the clock frequency of the received signal, so that during reception the tuning cannot be changed using the method of finding the location where the synchronization is lost. In the preferred embodiment, the receiver applying the invention makes the tuning correction according to the invention immediately after it has stopped receiving the information coming to it. After the tuning correction the receiver can enter the passive state.

Figure 2:
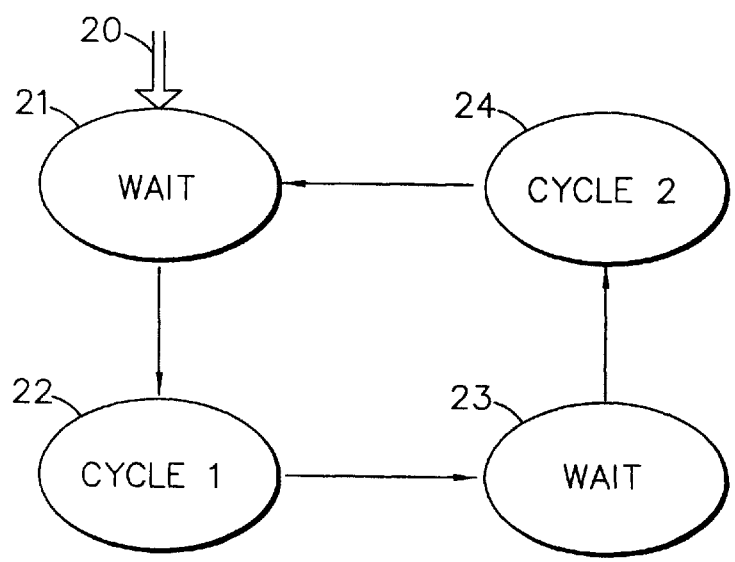
FIG. 2 shows a simple state diagram of a first preferred embodiment of the method according to the invention.

FIG. 2 shows a state diagram of an advantageous embodiment of the method according to the invention, in which the tuning correction is divided into two successive operation cycles. Operation starts at the location depicted by arrow 20, as the receiver finds a desired reception channel by means of a known procedure. The receiver is tuned to a certain "current tuning frequency" when the intermediate frequency, to which the signal is mixed in reception, is on the pass band of the receiver's IF filter. In state 21 the receiver is waiting for a suitable opportunity to start the tuning correction. Above it was stated that a suitable opportunity is the end of a particular reception period, for example, whereby the receiver goes into state 22 representing the first operation cycle. Then comes a new wait period in state 23, and as the next suitable opportunity arises the receiver goes into state 24 representing the second operation cycle, whereafter the operation starts over from the beginning, state 21.

Figure 3:
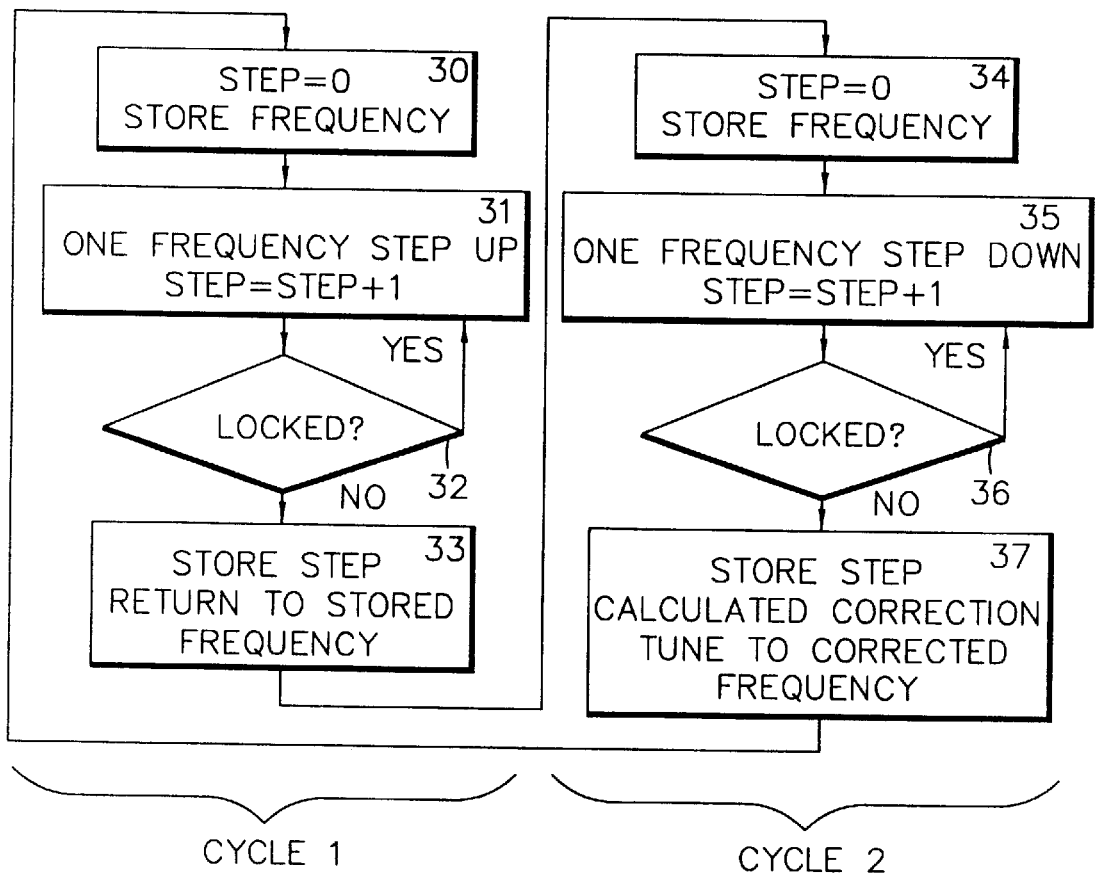
FIG. 3 shows a flow chart of the first preferred embodiment of the method according to the invention.

FIG. 3 shows a flow chart for the operation cycles of FIG. 2, ie. operation in states 22 and 24. At the beginning of the first operation cycle, in step 30, the receiver stores the current tuning frequency in memory and resets, ie. sets to 0, a certain STEP counter representing tuning steps. In the next step 31, the receiver changes the tuning one step upward and increments the STEP counter value by one. Here it is assumed that the tuning of the receiver is carried out in steps, and the size of a step can be a fixed or a dynamically changing parameter. However, the size of a step is so small as compared to the reception frequency bandwidth in use that a tuning change of one or a few steps corresponds to finding the optimal tuning inside a frequency band and not to changing from a channel to another. In step 32 the receiver examines whether the synchronizing element in the decoder stays locked to the clock frequency of the received signal after the tuning step. The receiver repeats the loop formed by steps 31 and 32 until locking is lost. In an alternative embodiment, the STEP counter value can have an upper limit, so that the receiver goes from step 32 to step 33 when the upper limit is reached even is locking were not lost. In step 33 the receiver stores the STEP counter value that indicates how many tuning steps upward from the previous tuning frequency were needed until the locking was lost. In addition, the receiver restores the tuning to the frequency stored in step 30.

The first operating cycle ends at step 33. At the beginning of the second operation cycle the receiver sets the STEP counter value to zero and stores the current tuning frequency in memory in step 34. The loop formed by steps 35 and 36 corresponds to steps 31 and 32 of the first operation cycle, however in such a manner that the receiver changes the tuning step by step downwards, not upwards. When the receiver notices in step 36 that the locking is lost, it goes to step 37 where it calculates the difference between the steps taken upward and downward before the locking was lost and selects a new tuning frequency which differs from the previous tuning frequency by half of the difference calculated. If, for example, it was taken seven steps up and five steps down before the locking was lost, the difference is two, and the receiver corrects the tuning frequency by one step up. If the difference of the steps up and down is an odd number, which does not yield an integer when halved, the receiver rounds off the result to the nearest integer. It is obvious that the up and down directions in the embodiment shown in FIG. 3 are mutually exchangeable, so that the receiver takes tuning steps down in the first operation cycle, and up in the second operation cycle.

Figure 4:
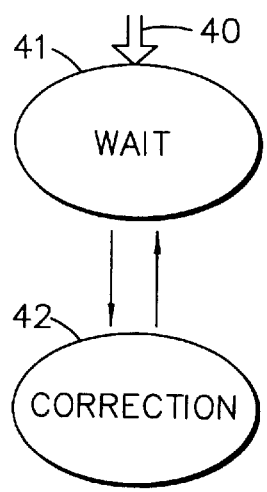
FIG. 4 shows a simple state diagram of a second preferred embodiment of the method according to the invention.

In the embodiment described above, the receiver corrects the tuning frequency only after every second active period. An embodiment is also possible that has no two separate operation cycles by the receiver carriers out the whole series of operations needed for the tuning correction each time it has stopped receiving information. FIG. 4 shows a state diagram for such an embodiment. Arrow 40 corresponds to arrow 20 in FIG. 2, so operation according to the state diagram starts when a certain channel is found. In state 41, the receiver is waiting for a suitable opportunity to start the tuning correction and in state 42 it corrects the tuning in the manner according to the invention. A first possibility is to examine according to the embodiment shown in FIG. 3, ie. first one direction (in FIG. 3, upward) until the locking is lost, and then the other direction.

Figure 5:
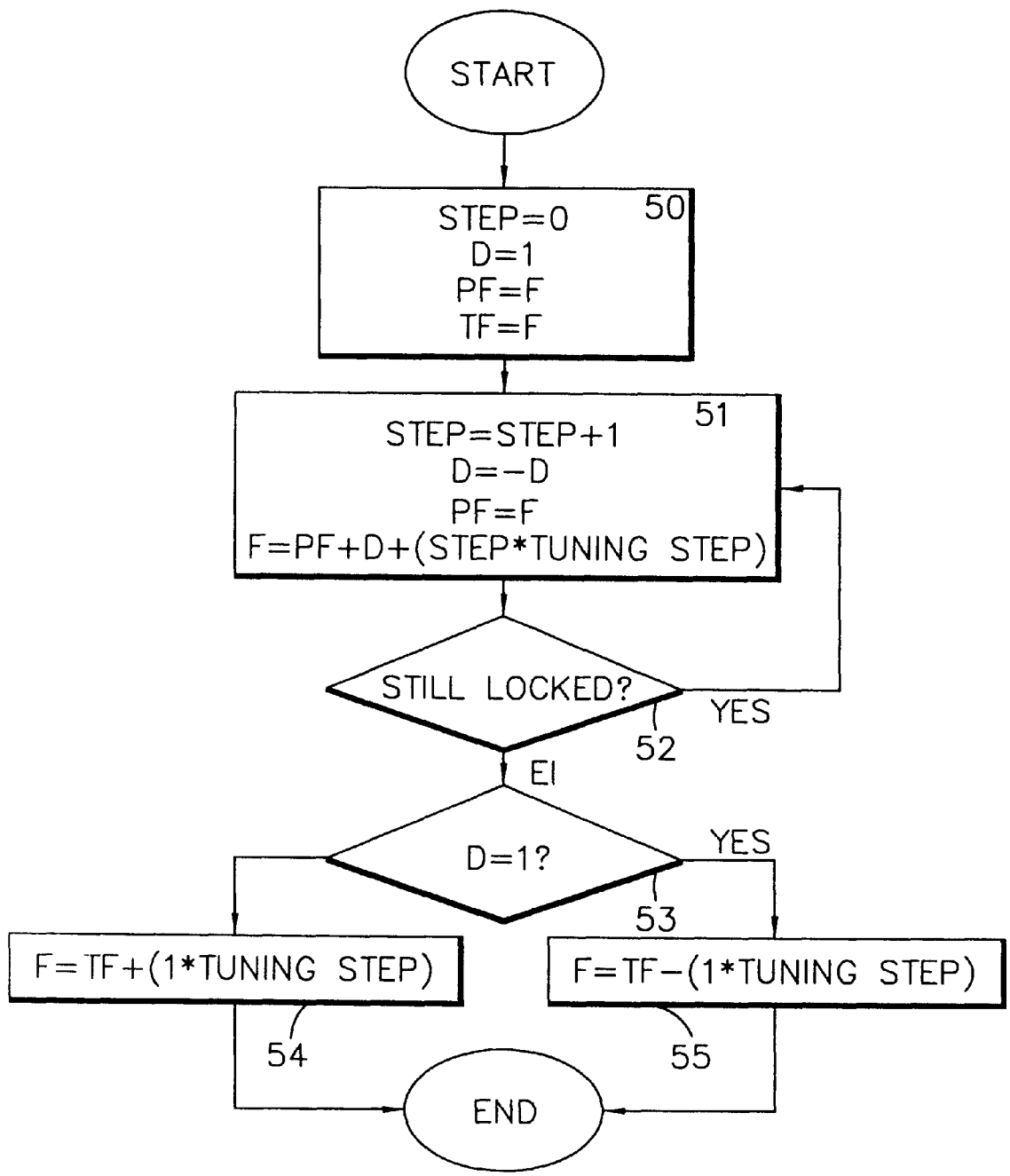
FIG. 5 shows a flow chart of the second preferred embodiment of the method according to the invention.

FIG. 5 shows and alternative embodiment of the method according to the state diagram shown in FIG. 4, wherein the receiver, in step 50, sets the STEP counter to zero, specifies the first direction (here, up), stores the current frequency in variable PF and stores the current tuning frequency in memory as variable TF. In step 51, the receiver increments the STEP counter value by one, changes the sign of variable D representing the direction (absolute value of D is always 1), sets the value of variable PF to the current frequency and selects as a new frequency F a frequency that is a number of tuning steps away from the frequency indicated by variable PF, in the direction indicated by variable D, said number of tuning steps determined by the value of the STEP counter. In step 52, the receiver examines whether the locking is lost. As long s the locking is not lost, the receiver executes the loop formed of states 51 and 52. When the locking is lost, the receiver examines, using the sign of variable D, in step 53, which was the last stepping direction. Steps 54 and 55 are mutually exclusive alternatives: the receiver selects a new tuning frequency which is one step away from the previously stored previous tuning frequency, but the direction depends on where, ie. on which side of the previous frequency, the locking was lost. If the locking was lost above the previous tuning frequency, the new tuning frequency is below the previous one. If the locking was lost below the previous tuning frequency, the new tuning frequency is above the previous one.

The embodiment of the invention shown in FIG. 5 can be described as follows: the receiver extends the frequency band examined one step at a time, alternately in both directions from the original tuning frequency, until it encounters the closest frequency at which the locking is lost. As above, the frequency can be called the critical frequency. Then the tuning frequency is corrected from the previous tuning frequency in the direction opposite to that of the critical frequency, ie. the frequency at which the locking was lost. The magnitude of the correction is advantageously one step, but it may also be greater. Assuming that the frequency band on which locking is possible has always a certain minimum width and the limit that causes the locking to be lost is encountered only one or two steps away from the old tuning frequency, the receiver can assume that the necessary correction in the opposite direction could be more than just one step.

Figure 6:
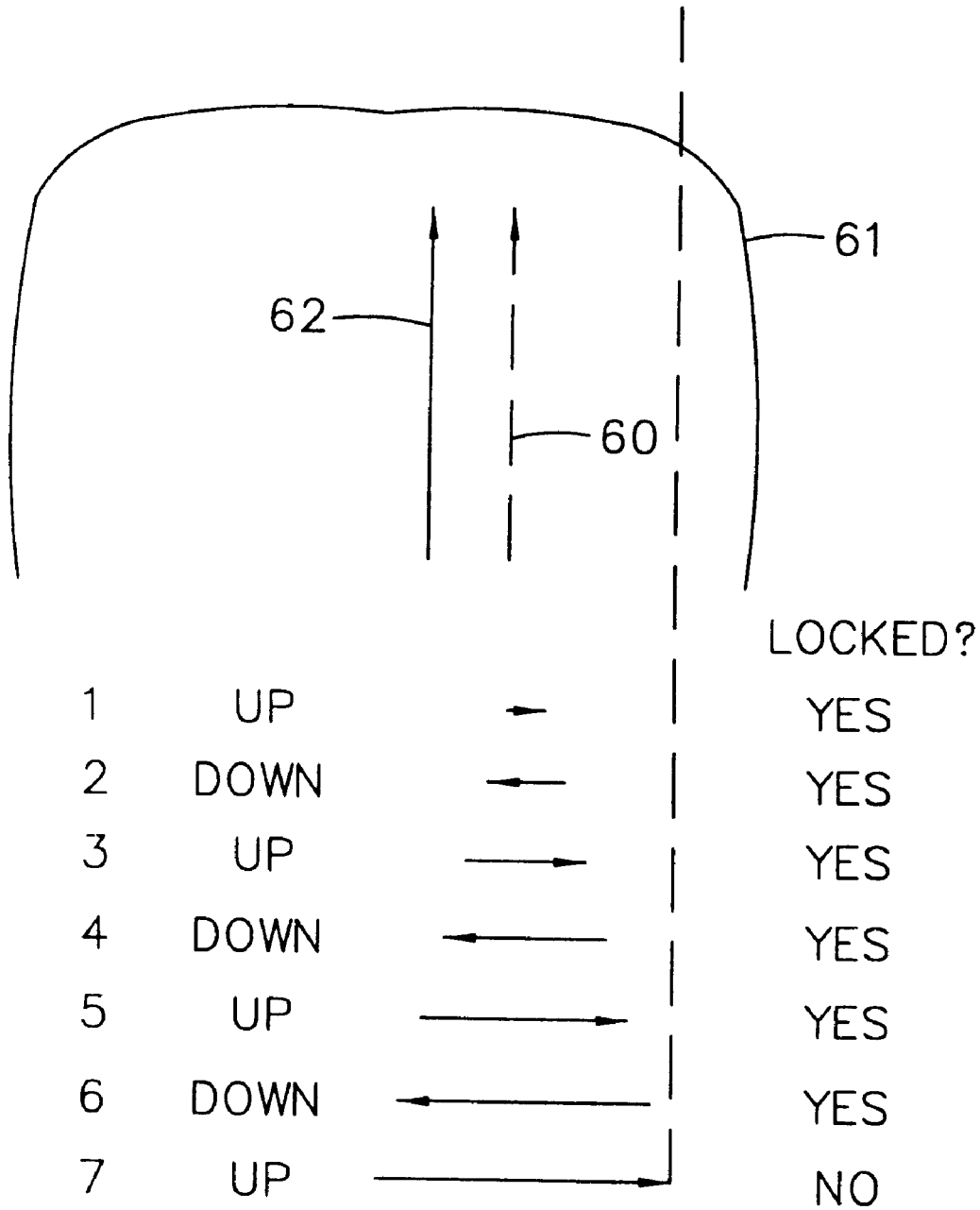
FIG. 6 shows symbolically the method according to the invention in a case.

Arrow 60 depicted by a thick broken line FIG. 6 represents the original tuning frequency and curve 61 symbolizes the transmission of a certain IF filter as a function of frequency, showing that if the tuning approaches the edge of the transmission curve, the signal brought to the decoder is considerably weakened and the locking is lost. The horizontal arrows depict, from top down, the extending of the frequency band examined as follows: first the receiver examines the frequency which is one step above (here, to the right), then the frequency which is one step below the original tuning frequency and of on until the seventh step transition upwards ends up so close to the transmission curve edge that the locking is lost. As a consequence, the receiver selects the frequency depicted by the thin arrow 62 as the new tuning frequency which is one step below the original tuning frequency 60.

The method described in FIGS. 5 and 6 shifts and frequency always by one step even if the original tuning frequency were right in the middle of the optimal range. To prevent this, a feature can be added in the method that restricts unnecessary tuning frequency changes. For example, if the locking is lost a distance away from the original tuning frequency, said distance being further than a certain threshold value, it can be deduced that the situation is almost optimal without any changes to the tuning frequency. In an embodiment of the invention, it is possible to examine, after the locking is lost on one side of the current frequency, how far away on the other side of the current frequency the locking will be lost. If a critical frequency is found at the same distance on both sides of the current frequency, the tuning need not be corrected.

The embodiment, in which the tuning correction is carried out in accordance with FIGS. 4, 5 and 6 every time the receiver starts to examine frequencies other than the current tuning frequency, it disadvantageous in that after each reception period the reception part and the decoder must be on for longer than in the embodiment according to FIGS. 2 and 3. This is not advantageous from the power consumption standpoint. However, the embodiment according to FIGS. 4, 5 and 6 reacts to changes in the radio channel faster than the other embodiment and, therefore, it is probably the more suitable one of these two embodiments for a receiver this is not stationary. The receiver can also during operation change from the method according to the first alternative to the method according to the second alternative if it notices that changes are needed often and they are big. Similarly, the receiver can change from the second alternative to the first if it notices that changes are needed seldom and they are small.

The method according to the invention does not make great hardware requirements of a radio receiver. A phase-locked loop or other arrangement for locking into a clock pulse already exists in most devices in which the invention can be applied. The arrangement is also capable of indicating whether locking is on or not. According to the invention, the tuning frequency of the radio device must be changeable in small steps. If course, an embodiment can be disclosed wherein the tuning frequency is changed steplessly, but than the tuning frequency change has to be measured using an arrangement other than the counting of tuning steps described above. In a modern radio device the tuning control block is usually a microprocessor, so the method according to the invention can be programmed into instructions that the processor will carry out along with other control operations. The processor receives as input the information about locking or non-locking and outputs the necessary commands concerning the change of tuning.

The method according to the invention corrects tuning changes caused by changes in the characteristics of components due to aging or temperature variation. It improves the operation of a receiver also in a situation in which there is another signal at a frequency near the frequency of the desired signal. The decoder will lose locking more easily on that side of the desired frequency where the competing signal is, so the method according to the invention corrects the tuning away from the interfering signal.

What is claimed is:

1. A method for tuning a radio receiver having an intermediate frequency filter to an optimal tuning frequency when receiving a radio signal with a clock frequency, comprising the steps of:

determining a current tuning frequency by tuning the radio receiver in such a manner that the intermediate frequency is on the pass band of the receiver's intermediate frequency filter, determining the closest critical frequency at which the radio receiver loses the locking to the clock frequency of the received radio signal, and correcting the tuning frequency according to the difference between the critical frequency found and the current tuning frequency.

2. The method of claim 1, wherein the radio receiver is tuned by changing the mixing frequency used in the down-conversion of the radio signal.

3. The method of claim 1, wherein when the critical frequency is found, the tuning frequency is corrected from the current tuning frequency in a direction other than where said critical frequency is located.

4. The method of claim 3, further comprising the steps of:

changing the tuning from the current tuning frequency in a first direction until the radio receiver loses the locking to the clock frequency of the received signal, measuring the magnitude of the required first tuning change, changing the tuning from the current tuning frequency in a second direction until the radio receiver loses the locking to the clock frequency of the received signal, measuring the magnitude of the required second tuning change, selecting the direction in which the measured magnitude of the tuning change is greater as the direction of tuning correction, and correcting the tuning from the current tuning frequency in the selected direction by an amount which is ½ of the absolute value of the difference of the first and second tuning change.

5. The method of claim 4, wherein the change and correction of tuning are carried out in steps of predetermined magnitude.

6. The method of claim 3, further comprising the steps of:

tuning correction is started from the current tuning frequency to examine a tuning frequency area, extending the tuning frequency area examined from the current tuning frequency by a predetermined first step alternately in both directions until a critical frequency is found at which the radio receiver loses the locking to the clock frequency of the received signal, choosing a direction for the tuning correction which is in the direction from the current tuning frequency opposite from that of the critical frequency found, and correcting the tuning by a predetermined second step in the direction chosen.

7. The method of claim 6, wherein said predetermined second step is equal to said predetermined first step.

8. The method of claim 1, wherein the step of determining the closest critical frequency is carried out in the radio receiver immediately after the radio receiver has stopped receiving information coming to it.

9. The method of claim 1, wherein if the difference between the critical frequency found and the current tuning frequency is greater than a certain threshold value, the tuning will not be corrected.

10. A radio receiver comprising:

a reception part with adjustable tuning, a control block, and a decoding part, connected to said reception part and said control block, comprising:

means for locking to a clock frequency in a received signal, and means for sending information to the control block about whether the locking is on, and wherein the control block comprises means for adjusting the tuning of the reception part in response to the information indicating whether the locking is on.

11. The radio receiver of claim 10, wherein said means for locking to a clock frequency in the received signal comprises a phase-locked loop.

12. The radio receiver of claim 10, wherein said receiver is a selective call receiver.

* * * * *